US008591068B2

(12) United States Patent
Grajcar

(10) Patent No.: US 8,591,068 B2
(45) Date of Patent: Nov. 26, 2013

(54) APPARATUS FOR HOUSING A LIGHT ASSEMBLY

(75) Inventor: Zdenko Grajcar, Crystal, MN (US)

(73) Assignee: Nexxus Lighting, Incorporated, Charlotte, NC (US)

( * ) Notice: Subject to any disclaimer, the term of this patent is extended or adjusted under 35 U.S.C. 154(b) by 0 days.

(21) Appl. No.: 13/204,114

(22) Filed: Aug. 5, 2011

(65) Prior Publication Data
US 2011/0292662 A1 Dec. 1, 2011

Related U.S. Application Data

(63) Continuation of application No. 12/274,286, filed on Nov. 19, 2008, now Pat. No. 7,993,031.

(60) Provisional application No. 60/988,954, filed on Nov. 19, 2007, provisional application No. 61/096,273, filed on Sep. 11, 2008.

(51) Int. Cl.
*F21V 29/00* (2006.01)
(52) U.S. Cl.
USPC .......................... 362/294; 362/362; 362/373
(58) Field of Classification Search
USPC ......... 362/96, 190, 234, 249.01, 294, 311.01, 362/311.02, 362, 373, 800; 257/79, 81, 257/98–100, 722; 313/44–46, 498–500, 313/512
See application file for complete search history.

(56) References Cited

U.S. PATENT DOCUMENTS 3,764,856 A 10/1973 Martin
6,787,999 B2 9/2004 Stimac et al.
(Continued)

FOREIGN PATENT DOCUMENTS

EP 1 594 170 A2 11/2005
EP 1 840 450 A1 10/2007
(Continued)

OTHER PUBLICATIONS

Notification of Transmittal of the International Search Report and the Written Opinion of the International Searching Authority, or the Declaration, Written Opinion of the International Searching Authority, and International Search Report all mailed Jun. 30, 2009 for PCT Application PCT/US2008/084089.

(Continued)

*Primary Examiner* — Hargobind S Sawhney
(74) *Attorney, Agent, or Firm* — Baker & Hostetler LLP

(57) ABSTRACT

An apparatus and related method for housing a light assembly apparatus includes a housing having a housing first end and a housing second end arranged along a central axis, the housing further includes a plurality of fins each having a fin first end and a fin second end, the plurality of fins forming a plurality of vents therebetween, each the plurality of fins has a curvature extending from the fin second end such that the plurality of fins converge towards the central axis proximate each fin first end, an endpiece proximate the housing first end and arranged proximate to the fin first end of each of the plurality of fins, the endpiece having a circular portion including a continuous circumference about the central axis, an electrical connector arranged proximate to the endpiece and arranged along the central axis, and a space arranged along the central axis proximate the housing second end and further configured with the plurality of fins and the plurality of vents arranged therearound, the space configured to, at least in part, house a light assembly. Other embodiments are disclosed as well.

21 Claims, 14 Drawing Sheets

(56) References Cited

U.S. PATENT DOCUMENTS

| | | | |
|---|---|---|---|
| 6,799,864 B2 | 10/2004 | Bohler et al. | |
| 7,540,761 B2 * | 6/2009 | Weber et al. | 439/487 |
| 7,628,513 B2 * | 12/2009 | Chiu | 362/311.02 |
| 7,658,511 B2 * | 2/2010 | Sugiyama et al. | 362/294 |
| 2004/0066142 A1 | 4/2004 | Stimac et al. | |
| 2005/0073244 A1 | 4/2005 | Chou et al. | |
| 2005/0083698 A1 | 4/2005 | Zampini et al. | |
| 2005/0111234 A1 * | 5/2005 | Martin et al. | 362/555 |
| 2005/0174780 A1 * | 8/2005 | Park | 362/294 |
| 2006/0007661 A1 | 1/2006 | Iketaki | |
| 2006/0018099 A1 | 1/2006 | Chen | |
| 2006/0261359 A1 * | 11/2006 | Huang | 257/98 |
| 2007/0083698 A1 | 4/2007 | Gonzalez et al. | |
| 2007/0230186 A1 | 10/2007 | Chien | |
| 2008/0123341 A1 | 5/2008 | Chiu | |
| 2009/0141500 A1 * | 6/2009 | Peng | 362/294 |
| 2010/0046223 A1 * | 2/2010 | Li et al. | 362/249.02 |

FOREIGN PATENT DOCUMENTS

| | | |
|---|---|---|
| EP | 1843403 | 10/2007 |
| JP | 6318486 | 11/1994 |
| JP | 10133608 | 5/1998 |
| JP | 2003-178602 | 6/2003 |
| JP | 2005-276956 | 10/2005 |
| JP | 2007-048638 | 2/2007 |
| JP | 2008-199011 | 8/2008 |
| KR | 20-0302769 | 2/2003 |
| KR | 10-0767738 | 10/2007 |
| TW | M 310 984 U | 5/2007 |
| WO | 2007/091832 | 8/2007 |

OTHER PUBLICATIONS

Notification of Transmittal of the International Search Report and the Written Opinion of the International Searching Authority, or the Declaration, Written Opinion of the International Searching Authority, and International Search Report all mailed Jun. 30, 2009 for PCT Application PCT/US2008/084091.

Notification of Transmittal of the International Search Report and the Written Opinion of the International Searching Authority, or the Declaration, Written Opinion of the International Searching Authority, and International Search Report all mailed Jun. 30, 2009 for PCT Application PCT/US2008/084094.

Notification of Transmittal of the International Search Report and the Written Opinion of the International Searching Authority, or the Declaration, Written Opinion of the International Searching Authority, and International Search Report, from PCT Application PCT/US2009/056520, all mailed Feb. 26, 2010.

Extended European Search Report and Supplementary European Search report and European Search opinion mailed Nov. 19, 2010 for European Patent Application No. 08851066.4.

Supplementary Search Report and Written Opinion issued in related application No. EP 08853026 on Mar. 6, 2013.

* cited by examiner

APPARATUS FOR HOUSING A LIGHT ASSEMBLY

CROSS-REFERENCE TO RELATED APPLICATIONS

This is a continuation of U.S. patent application Ser. No. 12/274,286, filed Nov. 19, 2008 now U.S. Pat. No. 7,993,031 which claims priority under 35 U.S.C. §119(e) to provisional U.S. Patent Application No. 60/988,954, filed on Nov. 19, 2007 and to provisional U.S. Patent Application No. 61/096,273, filed on Sep. 11, 2008, the disclosures of which are expressly incorporated by reference herein in their entirety.

BACKGROUND OF THE INVENTION

1. Field of the Invention

The invention is directed generally to a method and device for the thermal management of heat in electronic devices. More particularly, the invention is directed to thermal management of heat in electronic devices having printed circuit boards that may include light emitting diodes, or the like.

2. Related Art

Numerous electronic manufacturing techniques have attempted to deal with component placement on printed circuit boards (PCB) to minimize costs for producing electronic products. For many products, the types of electronic components involved may dictate particular layouts and the use of special arrangements to minimize heat build-up in the circuitry and components during use. However, there tends to be a limit to the effectiveness of the heat removal capabilities of current techniques, which might suppress progress in producing new products that have higher heat removal needs.

Accordingly, there is a need for a method and apparatus that provides improved heat dissipation techniques for printed circuit boards of various types so that components that produce more heat may be accommodated, including those devices for producing visible light.

SUMMARY OF THE INVENTION

The invention meets the foregoing need and provides a method and apparatus for thermal management in electronic devices and that furthermore includes other advantages apparent from the discussion herein. Moreover, the invention is directed to a method and device for thermal management in electronic devices with printed circuit boards (PCB). The apparatus includes at least one PCB. The PCB defines a first surface and a second surface, and the PCB may include a metal layer and a core. The core may define a first core surface and a second core surface. The metal layer may be secured to the first core surface. The apparatus may include an electronics package, which may be secured to the first surface of the PCB. The apparatus may include a plurality of pins, each of which may have a first end and a second end. The pins may be disposed about the PCB with the first ends generally proximate the electronics package such that heat generated by the electronics package may be received by the pins generally proximate the first ends. Generally, the pins may pass through the core generally from the first core surface to the second core surface to conduct heat generated by the electronics package through the core as heat is conducted from the first end toward the second end of the pins. A second PCB may be spaced apart from the first PCB with the pins securing the first PCB to the second PCB.

The invention may be implemented in a number of ways. According to one aspect of the invention, a device for producing light is provided that includes a housing configured to receive a light producing assembly that includes at least one electronics package which generates heat, and a plurality of vents configured in the housing to permit an air flow through the housing to conduct the generated heat out of the housing, wherein the light producing assembly comprises a plurality of printed circuit boards (PCBs) spaced at an interval and connected by a plurality of pins, the plurality of pins being configured to conduct at least a portion of the generated heat from the at least one electronics package mounted on at least one of the PCBs into the interval so that the air flow passes through the interval and out of the housing.

In another aspect, a device for producing light is provided that includes means for separating a plurality of printed circuit boards (PCBs) at an interval, each PCB including an electronics package, wherein one electronics package includes a plurality of light emitting diodes (LEDs) for generating white light, means for receiving external power for powering each electronics package, means for venting at least a portion of heat generated by at least one electronics package, and wherein at least a portion of the means for separating provides electrical conductivity between the plurality of PCBs and provides thermal conductivity into the interval for dissipation by the means for venting.

Yet in another aspect of the invention, a device for producing light is provided that includes first means for dissipating heat for a light emitting diode (LCD) assembly having two printed circuit boards (PCBs) and for separating the two PCBs at an interval, a housing to house the first means for dissipating heat, wherein a second means for dissipating heat is formed by the housing, wherein the first means for dissipating is connected thermally proximate an electronics package on one of the PCBs.

In another aspect, an apparatus for a light is provided that includes a housing having a circumference larger at a first end greater than a second end and configured to receive a light assembly having two printed circuit boards (PCBs) held apart at an interval by a plurality of pins to convey heat generated by at least one PCB into the interval and a plurality of fins configured to create a plurality of vents in the housing, the plurality of vents configured to be proximate the interval for permitting air flow into the housing and past the plurality of pins for conveying generated heat out of the housing.

In another aspect, a method of providing a lighting device includes providing a housing configured to receive a light producing assembly that includes at least one electronics package that generates heat and providing a plurality of vents configured in the housing to permit an air flow through the housing to conduct the generated heat out of the housing, providing a plurality of printed circuit boards (PCBs) spaced at an interval and connected by a plurality of pins, the plurality of pins being configured to conduct at least a portion of the generated heat from the at least one electronics package mounted on at least one of the PCBs into the interval so that the air flow passes through the interval and out of the housing.

In another aspect, an apparatus for a light assembly includes a housing including a housing first end and a housing second end arranged along a central axis, the housing further including a plurality of fins each having a fin first end and a fin second end, the plurality of fins forming a plurality of vents therebetween, each the plurality of fins has a curvature extending from the fin second end such that the plurality of fins converge towards the central axis proximate each fin first end, an endpiece proximate the housing first end and arranged proximate to the fin first end of each of the plurality of fins, the endpiece having a circular portion comprising a continuous circumference about the central axis, an electrical connector arranged proximate to the endpiece and arranged along the central axis and a space arranged along the central axis proximate the housing second end and further configured with the plurality of fins and the plurality of vents arranged therearound, the space configured to, at least in part, house a light assembly.

In yet another aspect, a light assembly apparatus includes a housing including a housing first end and a housing second end arranged along a central axis, the housing further includes a plurality of fins each having a fin first end and a fin second end, the plurality of fins forming a plurality of vents therebetween, each the plurality of fins being arranged substantially symmetrically about the central axis, an endpiece proximate the housing first end and arranged proximate to the fin first end of each of the plurality of fins, the endpiece having a circular portion comprising a continuous circumference about the central axis, an electrical connector arranged proximate to the endpiece and arranged along the central axis and a space arranged along the central axis proximate the housing second end and further configured with the plurality of fins and the plurality of vents arranged therearound, the space configured to, at least in part, house a light assembly.

In another aspect, a method for configuring a light assembly includes providing a housing having a first end and a housing second end and arranged along a central axis, providing a plurality of fins each having a fin first end and a fin second end, the plurality of fins forming a plurality of vents therebetween, each the plurality of fins has a curvature extending from the fin second end such that the plurality of fins converge towards the central axis proximate each fin first end, providing an endpiece proximate the housing first end and arranged proximate to the fin first end of each of the plurality of fins, the endpiece having a circular portion comprising a continuous circumference about the central axis, providing an electrical connector arranged proximate to the endpiece and providing a space arranged along the central axis proximate the housing second end and further configured with the plurality of fins and the plurality of vents arranged therearound, the space configured to, at least in part, house a light assembly.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1A:
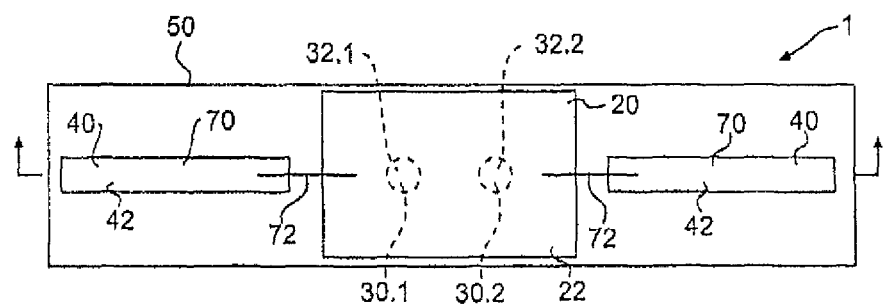
FIG. 1A illustrates in plan view an exemplary embodiment of an apparatus, configured according to principles of the invention.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the several views of the drawings.

Referring now to the various embodiments of the Figures, in various aspects, the apparatus 1 may include a printed circuit board (PCB) 10, which defines a first surface 12 and a second surface 14. An electronics package 20 may be disposed about the first surface 12 of the PCB 10, and the electronics package 20 may generate heat. The PCB 10 may include a metal layer 40 and a core 50, and, in some aspects, may include multiple cores 50 interposed between multiple metal layers 40. The metal layer 40 may be disposed on a core first surface 52 of the core 50. The metal layer 40 may include metal such as copper, silver, gold, other metal, or other conductive material or combinations thereof suitable to define traces 70, which are circuit paths for electronic components affixed to the PCB 10. The core 50 may include any of the well known and electrically non-conducting materials commonly used in PCB manufacture such as FR4. As the core 50 may be electrically non-conducting, the core 50 may be thermally insulating, and, accordingly, inhibit the transfer of heat from the electronics package 20 through the PCB 10.

The apparatus 1 may include one or more pins 30. Each pin 30 has a first end 32 and a second end 34, and is formed from heat conductive material or combinations of heat conductive materials. A plurality of pins 30 may be disposed about the PCB 10 with first ends 32 generally proximate the electronics package 20 and configured to conduct at least a portion of the heat away from the electronics package 20. The pins 30 may be configured with an orientation to pass generally through the PCB 10 from the first surface 12 to the second surface 14, with the first ends 32 of the pins 30 configured to be positioned generally proximate the electronics package 20 to provide paths for heat conduction from the electronics package 20 through the core 50 of the PCB 10. In certain aspects, portions of the pin 30, including the second end 34, may extend generally beyond the second surface 14 of the PCB to define an extension 36. The extension 36 may disperse or dissipate heat by convection and/or radiation. In such aspects, a plurality of pins 30 may include extensions 36 to form an array 120 which may further enhance heat dispersal.

In various aspects, the PCB 10 may include a backplane 60 having a backplane first surface 62 generally affixed to the core second surface 54 as shown in FIGS. 4B, 5B, 6B, 8B, 9 and 10. The backplane 60 may be comprised of a metal such as copper, aluminum, graphite, other conductive material, or combinations thereof. The backplane 60 may function, among other things, to provide a common potential for circuitry attached to the PCB 10 and/or to serve as a heat spreader to diffuse heat generated by the operation of the circuitry attached to the PCB 10 including the electronics package 20. As such, the backplane 60 may be electrically conductive and/or may be thermally conductive.

In embodiments of the PCB 10 that include the backplane 60, portions of the pins 30 may be configured to extend into at least portions of the backplane 60 in order to transfer heat from the pins 30 into the backplane 60 for dispersal. The pins 30 may be configured to extend into the backplane 60 to secure, at least in part, the backplane 60 to the core 50. In particular, the backplane 60 may include, at least in part, graphite, and the pins 30 may be configured to secure such a graphite backplane 60 to the core 50.

Each pin 30 may be a generally elongated member such as a nail, screw, bolt, strip, pin, or the like, and may be configured to conduct heat between the first end 32 and the second end 34. Accordingly, each pin 30 may be formed of copper, brass, steel, or various other metals, metal alloys, or other heat conductive materials, or combinations thereof. The pin 30 may have a generally constant cross-section between the first end 32 and the second end 34 or may be, at least in part, tapered between the first end 32 and the second end 34. The cross-section of the pin 30 may be substantially cylindrical, in some aspects, while, in other aspects, the pin 30 may have, for example, a polygonal cross-section such as rectangular or hexagonal cross-section. In still other aspects, the pin 30 may have a star shaped cross-section. In other aspects, the pin 30 may be flattened proximate the second end 34, perhaps enlarged, to provide a relatively larger surface area to increase heat dissipation. A portion of the pin 30, generally proximate the first end 32, may form a head 31 that could be, for example, either flat or rounded. A portion of the pin 30, generally proximate the second end 34, may generally define a point 33. In some aspects, the pin 30 may be configured to be driven into the PCB 10 by the application of force about the first end 32. In other aspects, the pin 30 may include threads and/or configured to be threadedly received into the PCB 10. In still other aspects, the pin 30 may be configured to be slidably received in a channel or other aperture associated with the PCB 10. The pin 30 may have various geometric configurations, include various materials, and may be placed in the PCB 10 in various ways as would be recognized by those of ordinary skill in the art upon review of this disclosure. Combinations of pins 30 having various lengths, materials, and/or geometries could be used in some aspects.

The extension 36 may extend generally beyond the backplane second surface 64 to disperse heat. Heat may be dispersed from the extension 36 by free convection and/or forced convection, as well as by radiation. In various aspects, a plurality of extended portions 36 may be configured to form an array 120, and the array 120 may dissipate heat by free convection and/or forced convection. In contrast to fins or other such structures, air may flow through the array 120 in multiple directions to convect heat from the array 120. As would be understood by those of ordinary skill in the art upon review of this disclosure, additional components such as, for example, fins for heat dispersion and structural members may be secured to the backplane second surface 64, and the additional components may be secured, at least in part, by one or more pins 30. Also, as would be understood by those of ordinary skill in the art upon review of this disclosure, various welds, adhesives, solders, and other mechanisms of attachment may be provided to secure various portions of the PCB 10 together, so that various adhesive and other layers may be interposed between the components in various aspects. For example, the core 50 may be adhesively secured to the backplane 60, which may interpose an adhesive layer generally between the core second surface 54 and the backplane first surface 62.

Figure 1B:
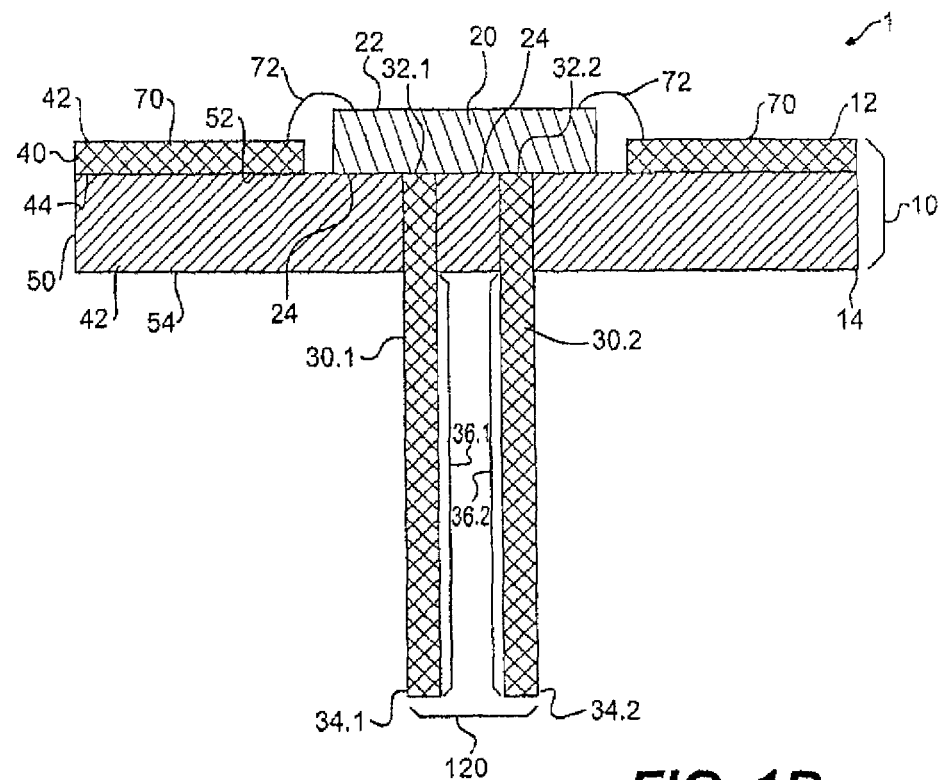
FIG. 1B illustrates a frontal view of the embodiment of FIG. 1A.

FIG. 1A illustrates in plan view an exemplary embodiment of an apparatus, configured according to principles of the invention, and FIG. 1B illustrates a frontal view of the embodiment of FIG. 1A. A PCB 10 may include a metal layer 40 and a core 50. The metal layer first surface 42 and portions of the core first surface 52 generally define the first surface 12 of the PCB 10, and the second surface 14 of the PCB 10 is generally defined by the core second surface 54, as illustrated. The metal layer 40 may have a second surface 44.

An electronics package 20 having a package first surface 22 and a package second surface 24 may be disposed about the first surface 12 of the PCB 10, as illustrated in FIGS. 1A and 1B, with portions of the package second surface 24 biased against portions of the core first surface 52. Traces 70 configured from the metal layer 40 may be disposed upon the core first surface 52, and the electronics package 20 may be in electrical communication with the traces 70 by electrical connectors 72, as illustrated. The electrical connectors 72 may be, for example, power leads, wire bonds, SMD leads, electrode pads, or the like.

As further illustrated in FIGS. 1A and 1B, pins 30.1, 30.2 may be configured to pass through the PCB 10 including the core 50 from the core first surface 52 to the core second surface 54 to conduct heat generated by the electronics package 20, generally from the first surface 12 to the second surface 14. The first ends 32.1, 32.2 of pins 30.1, 30.2 may be placed proximate the core first surface 52 and proximate the package second surface 24 to receive heat from the package second surface 24 of the electronics package 20. In some embodiments, portions of the first ends 32.1, 32.2 may be generally biased against the package second surface 24. The pins 30.1, 30.2 may conduct the heat from the first ends 32.1, 32.2 through the core 50 from the core first surface 52 to the core second surface 54, and generally to the second ends 34.1, 34.2. As illustrated, portions of the pins 30.1, 30.2, generally proximate the second ends 34.1, 34.2, may protrude generally beyond the core second surface 54 to define extensions 36.1, 36.2. At least some heat conducted through the core 50 from the electronics package 20 may be dispersed, at least in part, by convection and/or radiation from the extensions 36.1, 36.2. The extensions 36.1, 36.2 may define the array 120, as illustrated. In other embodiments, the second ends 34.1, 34.2 may lie generally between the core first surface 52 and the core second surface 54, and/or may be generally proximate the core second surface 54 to disperse heat from the core second surface 54.

Figure 2A:
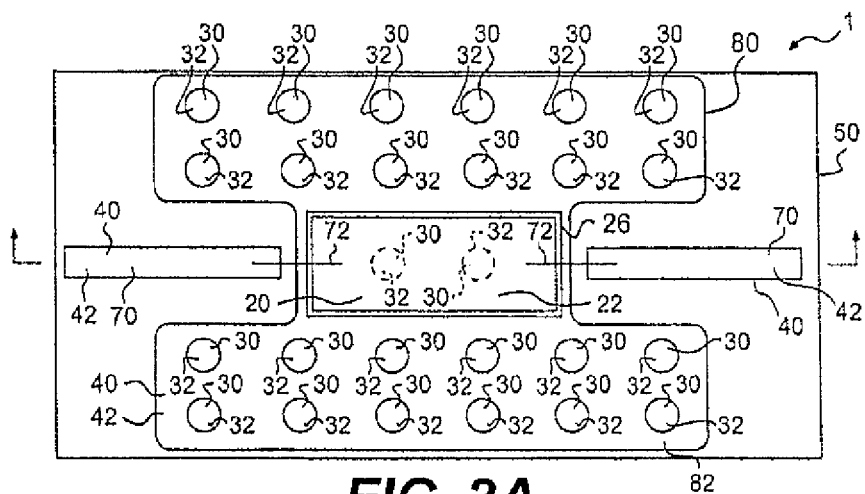
FIG. 2A illustrates in plan view an exemplary embodiment of an apparatus, configured according to principles of the invention.
Figure 2B:
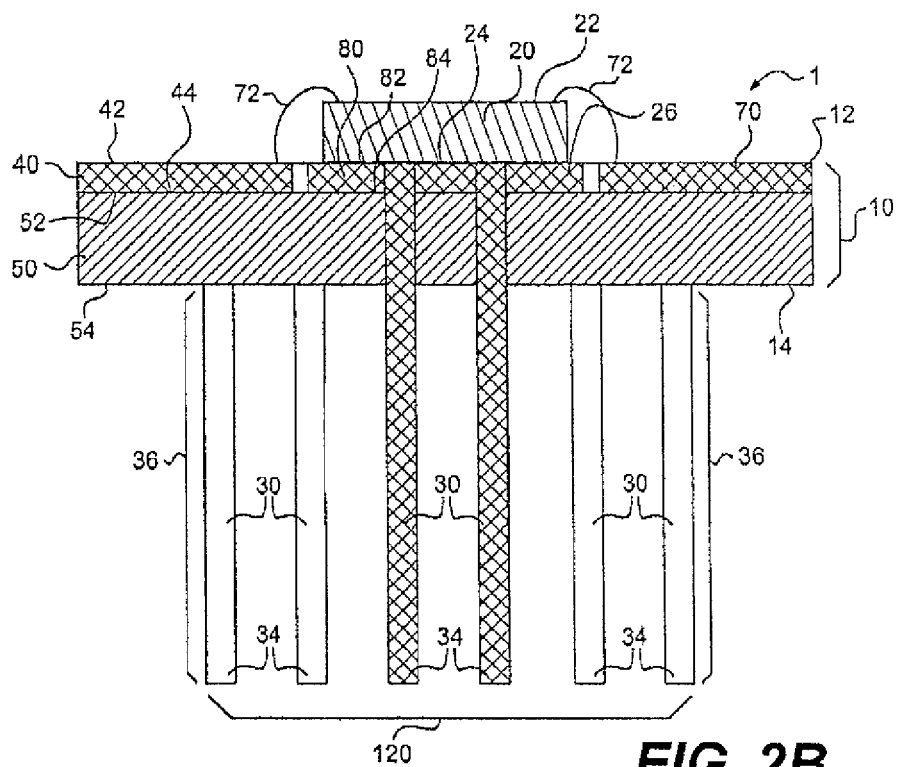
FIG. 2B illustrates a frontal view the embodiment of FIG. 2A.

FIG. 2A illustrates in plan view an exemplary embodiment of an apparatus, configured according to principles of the invention. FIG. 2B illustrates a frontal view of the embodiment of FIG. 2A. In FIGS. 2A and 2B, a PCB 10 that includes a metal layer 40 and a core 50 is generally illustrated. The metal layer 40 may include a first surface 42 and portions of the core first surface 52 may generally define the first surface 12 of the PCB 10. The second surface 14 of the PCB 10 may be generally defined by the core second surface 54, as illustrated.

As illustrated, portions of the metal layer 40 define traces 70. Other portions of the metal layer 40 may define a pad 80 having a pad first surface 82 and a pad second surface 84, with the pad 80 electrically isolated from the traces 70, as illustrated. The electronics package 20 may be disposed about the first surface 12 of the PCB 10, as illustrated in FIGS. 2A and 2B, with portions of the package second surface 24 generally abutting portions of the pad first surface 82, so that the electronics package 20 may be in thermal communication with the pad 80 to distribute heat from the electronics package 20 into the pad 80. The electronics package 20 may be in electrical communication with the traces 70 by electrical connectors 72, as illustrated.

As further illustrated in FIGS. 2A and 2B, a plurality of pins 30 may be configured to be disposed about the pad 80 to conduct heat from the pad 80 through the core 50. The pins 30 may pass through the PCB 10 including the pad 80 from the pad first surface 82 to the pad second surface 84 and through the core 50 from the core first surface 52 to the core second surface 54 to conduct heat generally from the first surface 12 to the second surface 14. In this implementation, any heat generated by the electronics package 20 may be conducted from the package second surface 24 by the pad 80 and distributed to the pins 30 generally proximate the first ends 32 of the pins 30. The heat may be conducted through the core 50 from the core first surface 52 to the core second surface 54 by the pins 30, and the heat dispersed generally from the core second surface 54. As illustrated, heat conducted through the core 50 from the electronics package 20 may be dispersed, at least in part, by convection and/or radiation from the extensions 36 of the pins 30. In various implementations, the convective heat transfer from the array 120 formed by the extensions 36 may be either non-forced or forced.

In some implementations, at least some pins 30 may pass through the pad 80 from the pad first surface 82 to the pad second surface 84, and the first ends 32 may be generally proximate the pad first surface 82. In other implementations, at least some of the first ends 32 of the pins 30 may be generally proximate the pad second surface 84. In still other implementations, at least some of the first ends 32 of the pins 30 may be generally biased against the second surface 84 of the pad 80.

Figure 3A:
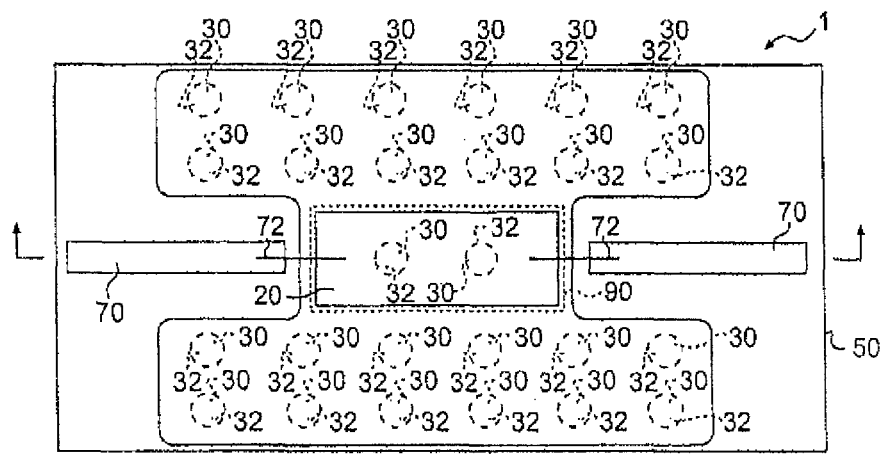
FIG. 3A illustrates in plan view an exemplary embodiment of an apparatus, configured according to principles of the invention.
Figure 3B:
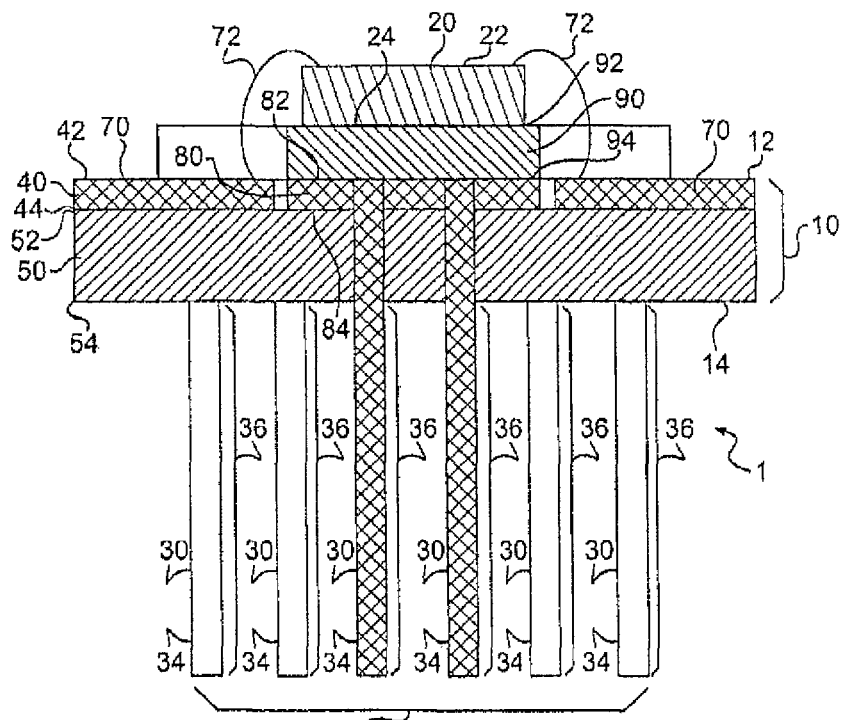
FIG. 3B illustrates a frontal view the embodiment of FIG. 3A.

FIG. 3A illustrates in plan view an exemplary embodiment of an apparatus, configured according to principles of the invention. FIG. 3B illustrates a frontal view of the embodiment of FIG. 3A. In FIGS. 3A and 3B, a PCB 10 that includes a metal layer 40 and a core 50 is generally illustrated. The metal layer first surface 42 and portions of the core first surface 52 may generally define the first surface 12 of the PCB 10. The second surface 14 of the PCB 10 may be generally defined by the core second surface 54, as illustrated.

Portions of the metal layer 40 may define traces 70, as illustrated. Other portions of the metal layer 40 may define a pad 80 having a pad first surface 82 and a pad second surface 84, with the pad 80 electrically isolated from the traces 70, as illustrated in FIGS. 3A and 3B. As illustrated, a heat slug 90 having a first heat slug surface 92 and a second heat slug surface 94 may be secured to the pad 80 with the second heat slug surface 94 generally abutting the first pad surface 82. In this implementation, the shape of the second heat slug surface 94 may generally conform to the shape of the first pad surface 82. The electronics package 20 may be disposed about the first surface 12 of the PCB 10, as illustrated, with portions of the package second surface 24 biased against portions of the heat slug first surface 82 so that the electronics package 20 is in thermal communication with the heat slug 90, which, in turn, may be in thermal communication with the pad 80 and, thence, with the pins 30 generally proximate the first ends 32. The electronics package 20, as illustrated, may be in electrical communication with the traces 70 by electrical connectors 72.

As illustrated in FIGS. 3A and 3B, the plurality of pins 30 may be disposed about the pad 80. The pins 30 pass through the PCB 10 including the core 50 generally from the core first surface 52 to the core second surface 54 to conduct heat from the first side 12 to the second side 14 of the PCB 10. In this implementation, heat generated by the electronics package 20 may be conducted from the package second surface 24 through the heat slug first surface 94 into the heat slug 90. Heat may be conducted from the heat slug second surface 94 through the pad first surface 82 into the pad 80 to generally distribute heat from the electronics package 20 throughout the heat slug 90 and the pad 80. Heat may be conducted into the pins 30 generally proximate the first ends 32 of the pins 30 from the pad 80 and/or the heat slug 90, and the pins 30 may conduct heat through the core 50 from the core first surface 52 to the core second surface 54 to allow the heat to be dispersed generally from the core second surface 54, which, in this implementation, defines the second surface 14 of the PCB 10.

In various implementations, the pins 30 may be configured to be in thermal communication with the pad 80 and/or with the heat slug 90 by being at least in part positioned proximate the pad 80 and/or heat slug 90, by passing through at least a portion of the pad 80 and/or heat slug 90, perhaps by being biased against or otherwise in mechanical contact with or soldered/welded to the pad 80 and/or the heat slug 90, or in other ways as would be readily recognized by those of ordinary skill in the art upon review of this disclosure, or combinations thereof. As illustrated in FIGS. 3A and 3B, portions of the pins 30 configured to be generally proximate the second ends 34 form extensions 36 to disperse heat, at least in part, by convection and/or radiation.

Figure 4A:
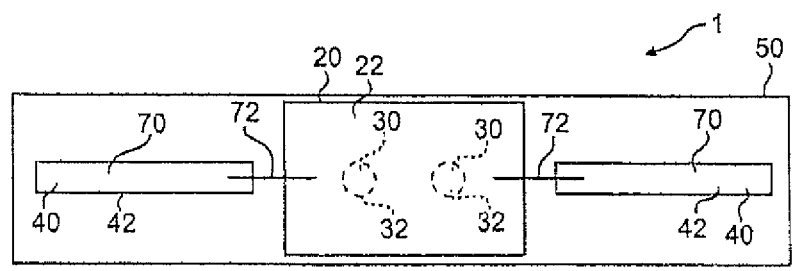
FIG. 4A illustrates in plan view an exemplary embodiment of an apparatus, configured according to principles of the invention.
Figure 4B:
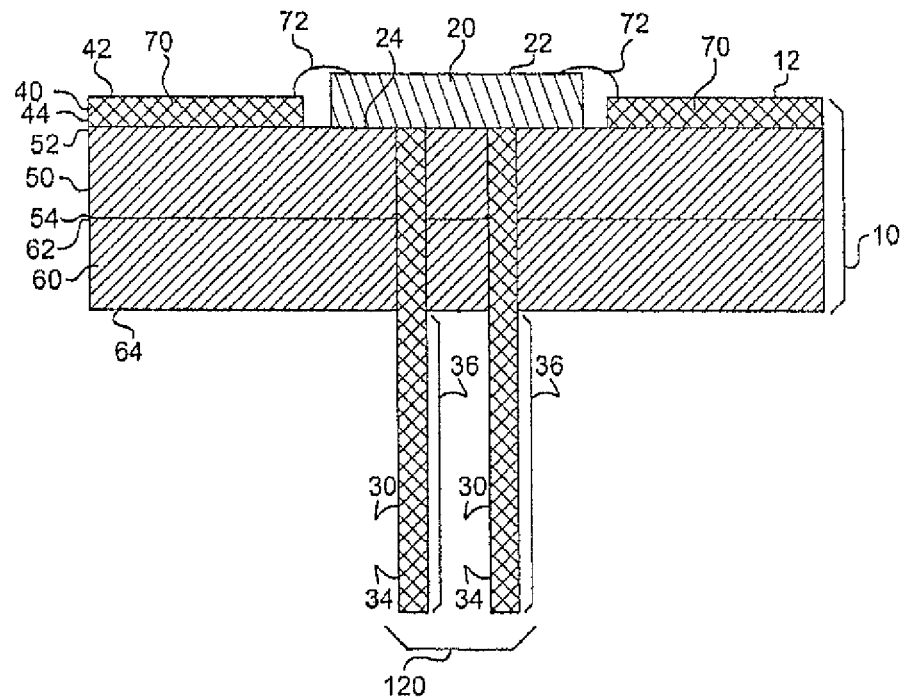
FIG. 4B illustrates a frontal view the embodiment of FIG. 4A.

FIGS. 4A and 4B generally illustrate a PCB 10 that includes the metal layer 40, the core 50, and the backplane 60, with the backplane 60 comprising a heat conductive material such as, for example, a metal, graphite, or the like. The metal layer first surface 42 and portions of the core first surface 52 may be configured to generally define the first surface 12 of the PCB 10. The second surface 14 of the PCB 10 may be generally defined by the backplane second surface 64, as illustrated.

The electronics package 20 may be disposed about the first surface 12 of the PCB 10, as illustrated in FIGS. 4A and 4B, with portions of the package second surface 24 biased against portions of the core first surface 52 or soldered/welded thereto to transfer heat by conduction through the package second surface 24 to the core first surface 52. In other implementations, the package second surface 24 may be generally set apart, at least in part, from the core first surface 52 so that heat may be transferred by radiation and/or convection from the package second surface 24 to the core first surface 52. Traces 70 configured from the metal layer 40 may be disposed upon the core first surface 52, and the electronics package 20 may be in electrical communication with the traces 70 by electrical connectors 72, as illustrated.

The core 50 may be sandwiched between the metal layer 40 and the backplane 60, as illustrated in FIGS. 4A and 4B. The core 50, which may be a thermal and electrical insulator, may inhibit conduction of heat emitted by the electronics package 20 to the backplane 60 and, hence, may inhibit the dispersal of heat generated by the electronics package 20 from the backplane 60. As illustrated, pins 30 may be configured to pass through the core 50 from the core first surface 52 to the core second surface 54 and through the backplane 60 from the backplane first surface 62 to the backplane second surface 64 and beyond to conduct heat from the electronics package 30 to the backplane 60 in order to diffuse the heat generated by the electronics package 20 throughout the backplane 60. The first ends 32 of the pins 30 may be placed proximate the package second surface 24 to be in thermal communication with the package second surface 24 in order to conduct heat generated by the electronics package 20 from the package second surface 24 through the core 50 from the core first surface 52 to the core second surface 54 and into the backplane 60. The backplane 60 may disperse the heat generally from the backplane second surface 64 by convection and/or radiation or the like.

As illustrated, portions of the pins 30, generally proximate the second ends 34, may define extensions 36 that protrude generally outward from the backplane second surface 64. Heat may be dispersed, at least in part, by convection and/or radiation from the extensions 36.

Figure 5A:
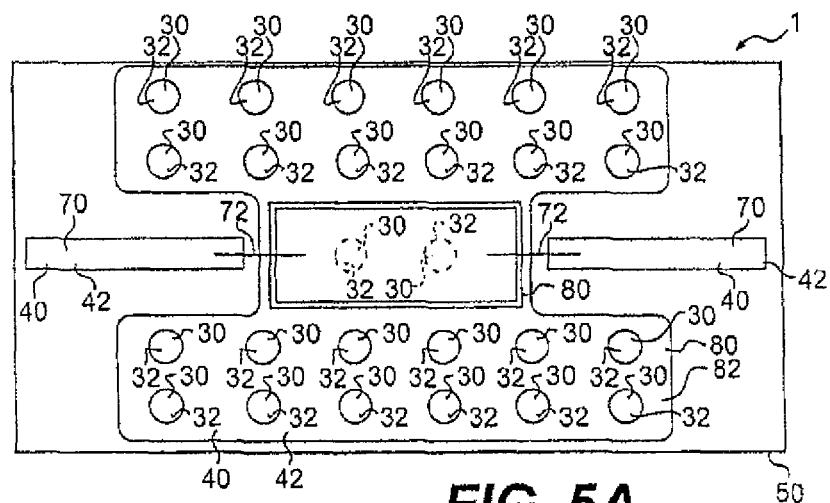
FIG. 5A illustrates in plan view an exemplary embodiment of an apparatus, configured according to principles of the invention.
Figure 5B:
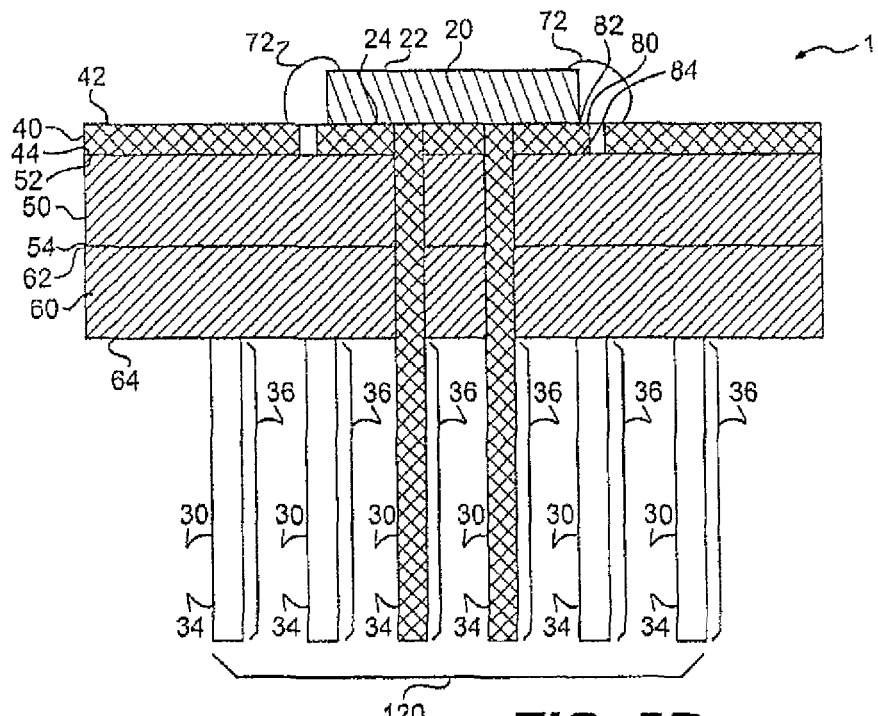
FIG. 5B illustrates a frontal view the embodiment of FIG. 5A.

FIGS. 5A and 5B generally illustrate a PCB 10 that includes the metal layer 40, the core 50, and the backplane 60. The backplane 60 may include a heat conductive material. Portions of the metal layer 40 may define traces 70, as illustrated. Other portions of the metal layer 40 may define a pad 80 having a pad first surface 82 and a pad second surface 84, with the pad 80 electrically isolated from the traces 70 in the illustrated implementation. The electronics package 20 may be disposed about the first surface 12 of the PCB 10, as illustrated in FIGS. 5A and 5B, with portions of the package second surface 24 generally abutting portions of the pad first surface 82 so that the electronics package 20 may be in thermal communication with the pad 80. Accordingly, heat generated by the electronics package 20 may be distributed throughout the pad 80.

As illustrated, pins 30 may be disposed about the pad 80 to conduct heat from the pad 80 through the core 50 and into the backplane 60 in order to disperse heat generated by the electronics package 20 from the backplane 60. The first ends 32 of the pins 30, in this implementation, may be located generally about the pad first surface 82 of the pad 80. The pins 30 may pass through the pad 80 generally from the pad first surface 82 to the pad second surface 84, through the core 50 from the core first surface 52 to the core second surface 54 and through the backplane 60 from the backplane first surface 62 to the backplane second surface 64 and extend outward from the backplane second surface 64. The backplane 60 may disperse the heat generally from the backplane second surface 64 by convection and/or radiation. As illustrated, portions of the pins 30, generally proximate the second ends 34, protrude generally beyond the backplane second surface 64 to form extensions 36. Heat may be dispersed by convection and/or radiation from the extensions 36. The pins 30, in various implementations, may secure, or at least aid in securing, the backplane 60 to the core 50. In implementations wherein the backplane 60 includes graphite, the pins 30 may be advantageous for securing the graphite backplane 60 to the core. In various implementations, the pins 30 may have differing lengths. In various implementations, the second ends 24 may be configured to terminate within the backplane 60, or the second ends 34 of the pins 30 may be biased against the backplane first surface 62.

Figure 6A:
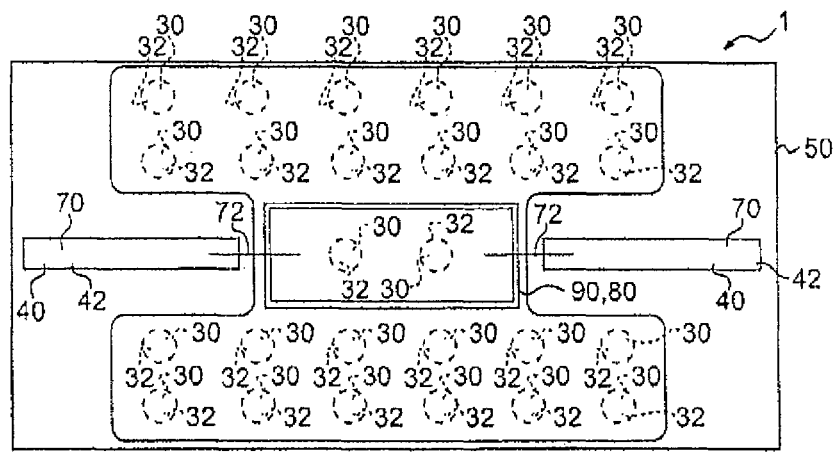
FIG. 6A illustrates in plan view an exemplary embodiment of an apparatus, configured according to principles of the invention.
Figure 6B:
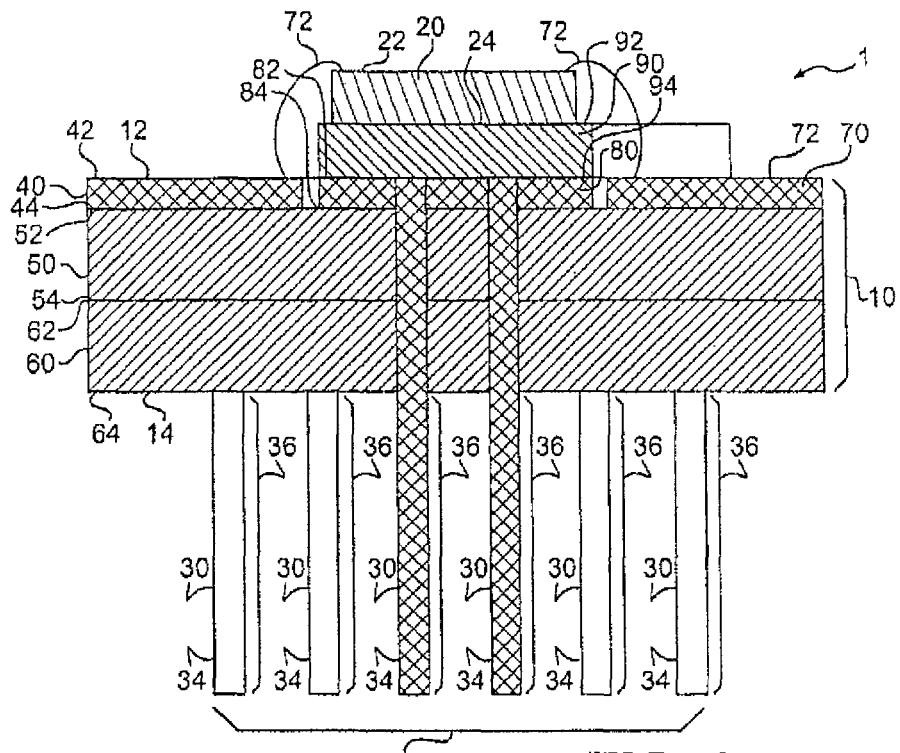
FIG. 6B illustrates a frontal view the embodiment of FIG. 6A.

FIG. 6A illustrates in plan view an exemplary embodiment of an apparatus, configured according to principles of the invention. FIG. 6B illustrates a frontal view of the embodiment of FIG. 6A. The implementation illustrated in FIGS. 6A and 6B includes a metal layer 40, a core 50, and a backplane 60. The backplane 60 may comprise a heat conductive material. Portions of the metal layer 40 may define traces 70, as illustrated, while other portions of the metal layer 40 may define the pad 80. The pad 80 may be electrically isolated from the traces 70. Also, as illustrated in FIGS. 6A and 6B, a heat slug 90 having a first heat slug surface 92 and a second heat slug surface 94 may be secured to the pad 80 with the second heat slug surface 94 generally abutting the first pad surface 82. The electronics package 20 may be configured to be disposed about the first surface 12 of the PCB 10, as illustrated, with portions of the package second surface 24 biased against portions of the heat slug first surface 82 so that the electronics package 20 may be in thermal communication with the heat slug 90 to distribute heat generated by the electronics package 20 throughout the heat slug 90 and pad 80. Pins 30 may pass through the pad 80, the core 50, and the backplane 60 to conduct heat generated by the electronics package 20 from the pad 80 and heat slug 90 to the backplane 60 for dispersal. Heat may be dispersed, at least in part, by convection and/or radiation from the extensions 36 that form array 120 in this implementation.

Figure 7A:
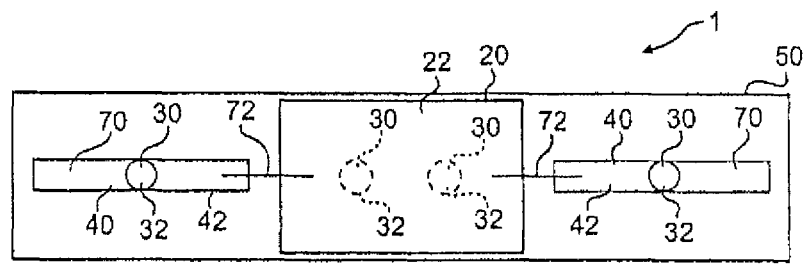
FIG. 7A illustrates in plan view an exemplary embodiment of an apparatus, configured according to principles of the invention.
Figure 7B:
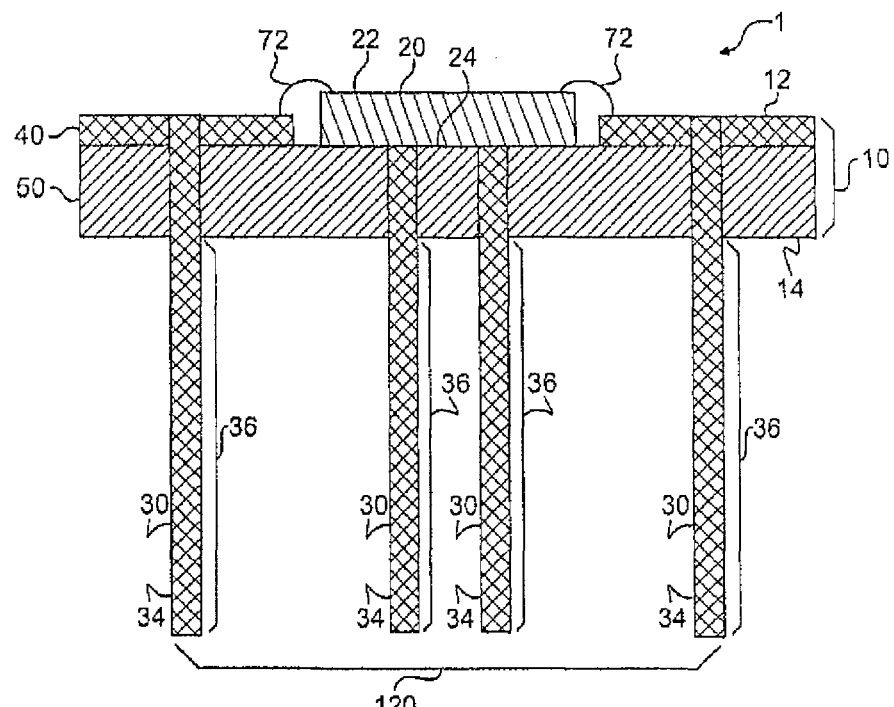
FIG. 7B illustrates a frontal view the embodiment of FIG. 7A.

FIG. 7A illustrates in plan view an exemplary embodiment of an apparatus, configured according to principles of the invention. FIG. 7B illustrates a frontal view of the embodiment of FIG. 7A. In this implementation, one or more pins 30 may be configured to pass at least partially through the trace(s) 70. As illustrated, the PCB 10 may include the metal layer 40 from which the traces 70 are configured, and the core 50. Pins 30 may be disposed about the electronics package 20 to conduct heat generated by the electronics package 20 from the first surface 12 to the second surface 14 to be dispersed. Pins 30 that pass at least partially through the traces 70 may pass at least partially into the core 50. The core 50 may electrically isolate the pins 30 so that substantially no short circuiting may occur through the core 50 between pins 30 when having differing potentials.

In other implementations that include the pad 80, the pad 80 may be electrically charged in order to supply power to the electronics package 20. Pins 30 that may contact the pad 80 in such implementations would be electrically isolated by the core so that substantially no short circuiting occurs through the core 50 between pins 30 when having differing potentials.

Figure 8A:
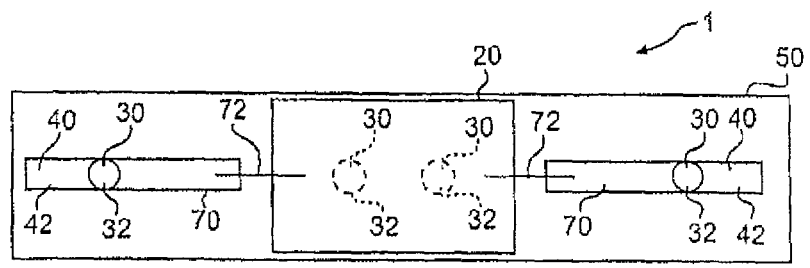
FIG. 8A illustrates in plan view an exemplary embodiment of an apparatus, configured according to principles of the invention.
Figure 8B:
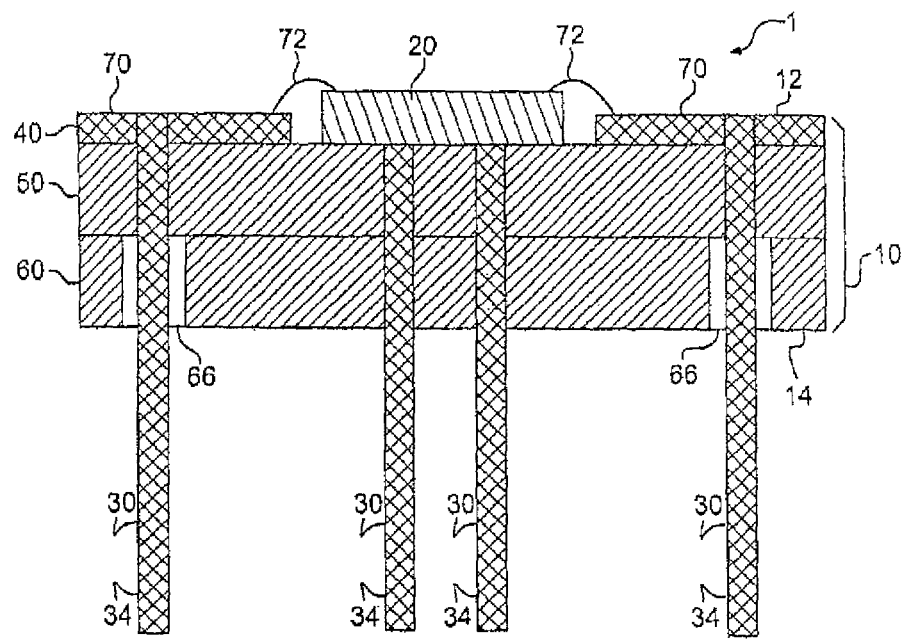
FIG. 8B illustrates a frontal view the embodiment of FIG. 8A.

FIG. 8A illustrates in plan view an exemplary embodiment of an apparatus, configured according to principles of the invention. FIG. 8B illustrates a frontal view the embodiment of FIG. 8A. One or more pins 30 may pass through the trace(s) 70, as illustrated in FIGS. 8A and 8B. Also, as illustrated, the PCB 10 may include the metal layer 40 from which the traces 70 may be configured, the core 50, and the backplane 60. Pins 30 may be disposed about the electronics package 20 to conduct heat generated by the electronics package from the first surface 12 to the second surface 14 for dispersal. Pins 30 that pass through the traces 70 may pass into the core 50. The core 50 may electrically isolate the pins 30 so that substantially no short circuiting occurs through the core 50 between pins 30, when they have differing potentials. As illustrated, the backplane 60 may include backplane cavities 66 that pass about respective pins 30 so that the pins 30 do not contact (i.e., are isolated from) the backplane 60 in order to prevent short circuiting between pins 30 through the backplane 60. The backplane cavities 66 may include a non-conducting or insulating material. The pins 30 may exchange heat with the backplane 60 by radiation and/or convection, and the pins 30 may also generally disperse heat through the portions of the pins 30 proximate the second ends 34 by radiation and/or convection in this implementation.

Because of the backplane cavities 66, the pins 30 do not directly contact the backplane 60, which may limit the heat conductance between the pins 30 and the backplane 60. In an alternative implementation, the pins 30 may be anodized or chemically treated, at least in part, so that the surfaces of the pins 30 are electrically non-conductive. The anodized pin 30 may pass through the trace 70, through the core 50 and into the backplane 60, perhaps with mechanical contact between the pins 30 and the backplane 60, to conduct heat generated by the electronics package from the first surface 12 to the backplane 60 without short circuiting. Similarly, in implementations wherein the pad 80 may be electrically charged, anodized pins 30 may electrically contact the pad 80 at the end 32 and contact the backplane 60 without short circuiting.

Figure 9:
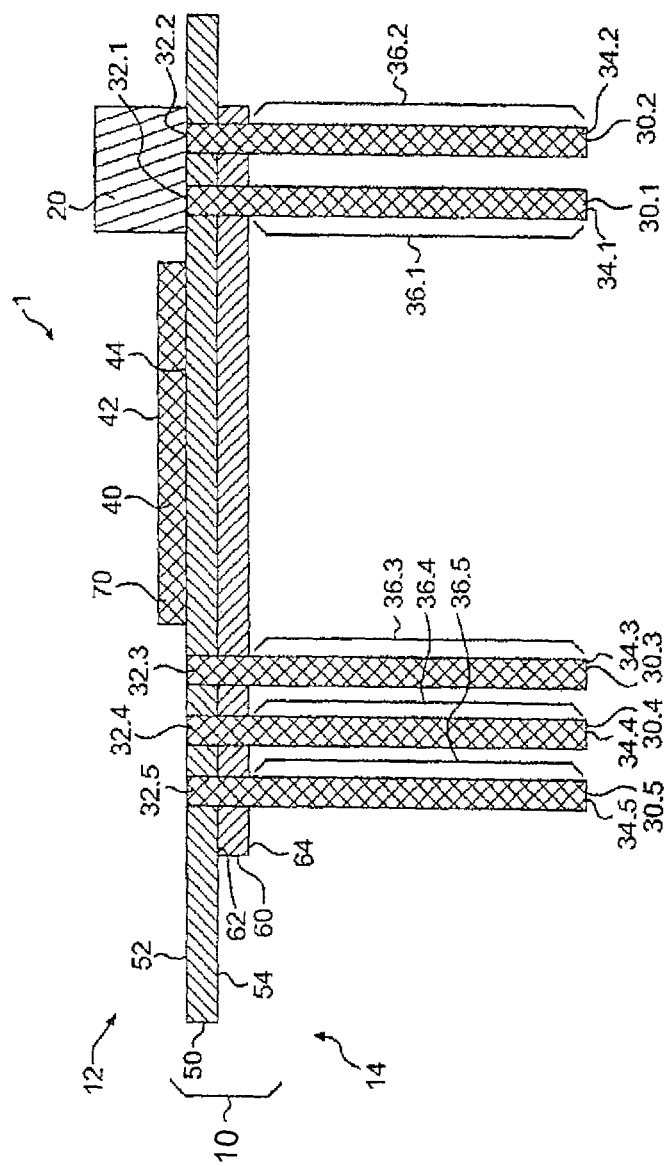
FIG. 9 illustrates a frontal view of an exemplary embodiment of an apparatus, configured according to principles of the invention.

FIG. 9 illustrates a frontal view of an exemplary embodiment of an apparatus, configured according to principles of the invention. As shown in this implementation, pins 30.1, 30.2 may pass through the PCB 10 including the core 50 to conduct heat generated by the electronics package 20 generally from the first surface 12 to the second surface 14. The pins 30.1, 30.2 may be configured to be disposed proximate the electronics package 20 and configured to be in thermal communication with the electronics package 20 so that heat generated by the electronics package 20 may be conducted through the package second surface 14 into the pins 30.1, 30.2 generally proximate the first ends 32.1, 32.2. The pins 30.1, 30.2 may conduct heat through the core 50 from the core first surface 52 to the core second surface 54. The pins 30.1, 30.2 may pass through the backplane 60, and heat may be conducted from the pins 30.1, 30.2 into the backplane 60. The backplane 60, in this implementation, may include graphite which conducts heat anisotropically. The preferred directions for heat conduction in the backplane 60, in this implementation, are parallel to the planes defined by the backplane first surface 62 and the backplane second surface 64. Thus, the backplane 60 may conduct heat from pins 30.1, 30.2, to pins 30.3, 30.4, 30.5, and heat may be generally dispersed by convection and/or radiation from the extensions 36.3, 36.4, 36.5 that protrude beyond the backplane second surface 64. As illustrated, heat conducted through the core 50 from the electronics package 20 may be dispersed, at least in part, by convection and/or radiation from the extensions 36.1, 36.2.

FIGS. 10A-10F each illustrate in perspective view a separate exemplary embodiment of a pin, configured according to principles of the invention.

Figure 10A:
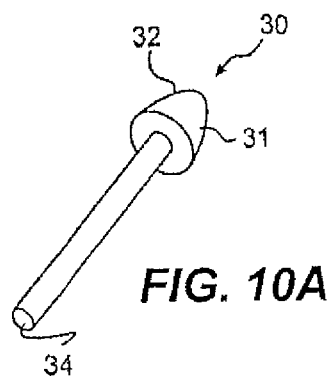
FIGS. 10A-10F each illustrate in perspective a separate exemplary embodiment of a pin, configured according to principles of the invention.
Figure 10B:
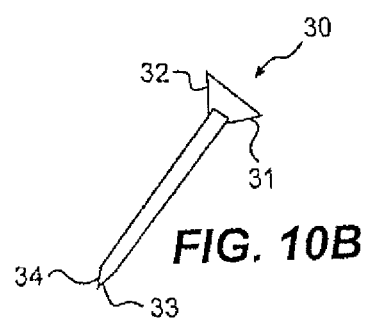
Figure 10C:
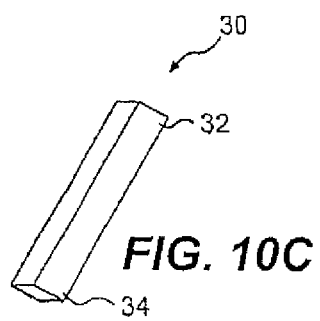
Figure 10D:
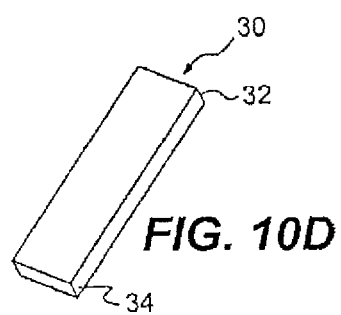
Figure 10E:
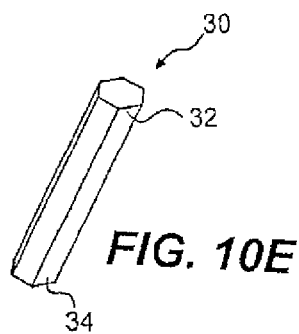
Figure 10F:
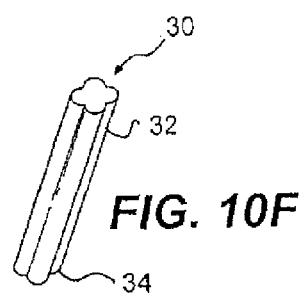

FIG. 10A illustrates a pin 30 configured to have a generally rounded head 31 at the first end 32. The pin 30 illustrated in FIG. 10B has a generally flat head 31 at the first end 32 and the second end 34 may be configured with a point 33. The pins 30 illustrated in FIGS. 10C, 10D, 10E, and 10F have generally square, generally rectangular, hexagonal, and star shaped cross-sections, respectively. The pin 30 may assume other shapes and configurations as would be recognized by those of ordinary skill in the art upon review of this disclosure.

Methods, in various aspects, may include arranging the apparatus 1, PCB 10, metal layer 40, core 50, and/or electronics package 20 with the pins 30. Further the method may include generating heat proximate the first surface 12 of the PCB 10 by an electronics package 20 and may include conducting the heat from the first surface 12 to the second surface 14, at least in part, using a plurality of pins 30. The methods may include dispersing heat from an array 120 defined by a plurality of extensions 36. The methods may include securing the backplane 60, at least in part by a plurality of pins 30.

In the apparatus described above, the electronics package 20 may include one or more lighting devices, computing devices, memory storage devices, communication devices, and/or the like. For example, the lighting devices may include LEDs and any associated electronics.

Further, with respect to the aspects described above, the apparatus 1 may be light, a computer, a storage device, a telecommunications device or the like, or any combination thereof.

Figure 11A:
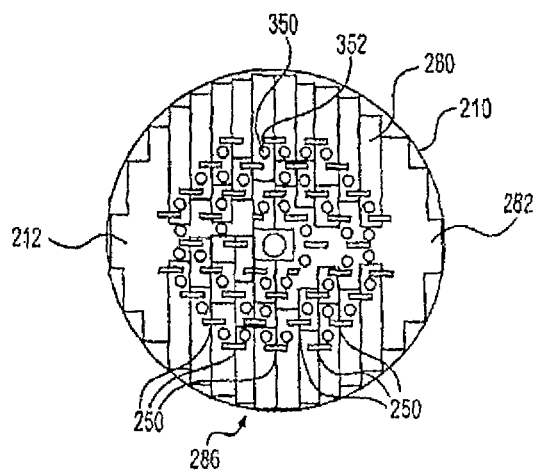
FIG. 11A illustrates in top view an exemplary embodiment of an apparatus according to the present invention.
Figure 11B:
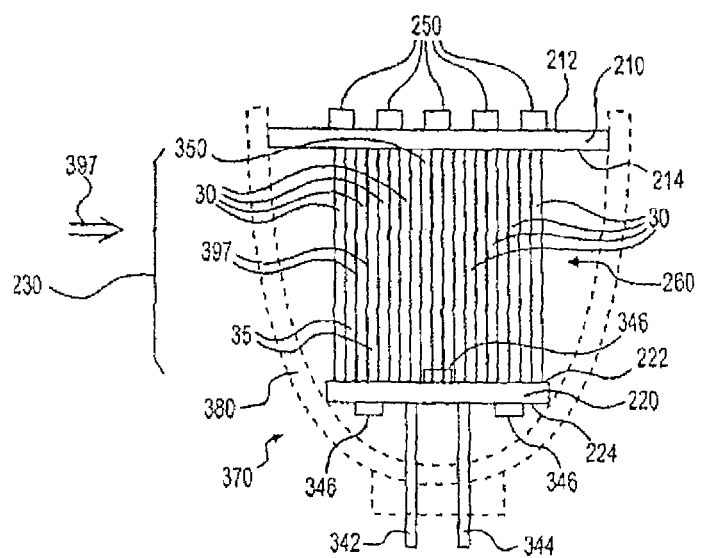
FIG. 11B illustrates in frontal view an exemplary embodiment of an apparatus according to the present invention generally corresponding to the embodiment of FIG. 11A.
Figure 11C:
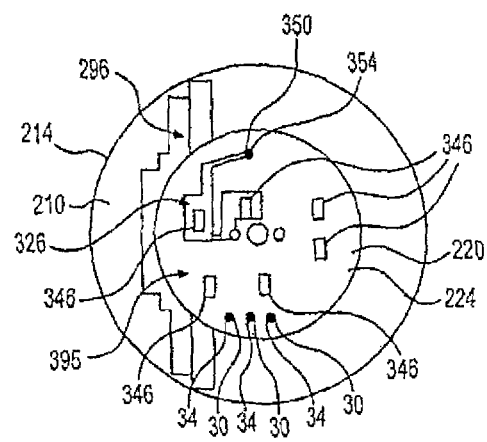
FIG. 11C illustrates in bottom view an exemplary embodiment of an apparatus according to the present invention generally corresponding to the embodiment of FIG. 11A.

FIGS. 11A, 11B, and 11C illustrate an exemplary implementation that may include a first PCB 210 and a second PCB 220, with the first PCB 210 set apart and secured at an interval 230 from the second PCB 220 by a plurality of pins 30. One or more LEDs 250 may be surface mounted to the first PCB first surface 212. The second PCB 220 may be configured to include a driver circuit 395 that may provide regulated electrical power to each of the one or more LEDs 250, in the illustrated exemplary implementation. As illustrated, the pins 30 may be disposed about the first PCB 210 such that portions of the pins 30, generally proximate the first ends 32, may be in thermal communication with the one or more LEDs 250 in order to conduct at least a portion of the heat generated by the one or more LEDs 250 through the first PCB 210 from the first PCB first surface 212 to the first PCB second surface 214 to disperse the at least a portion of the generated heat generally away from the first PCB second surface 214. The plurality of pins 30 may form an array 260 between the first PCB second surface 214 and the second PCB first surface 222 through which air flow 397, perhaps including the flow of other heat transfer media, may pass. Heat conducted by the one or more pins 30 from the one or more LEDs 250 through the first PCB 210 from the first PCB first surface 212 to the first PCB second surface 214 may be dispersed from the array 250 by either free or forced convective air flow 397 through the array. Heat may also be dispersed from the array 260 by radiation. In some embodiments, the first PCB 210 may have a circumference that mates with a circumference of the housing 380.

Figure 12:
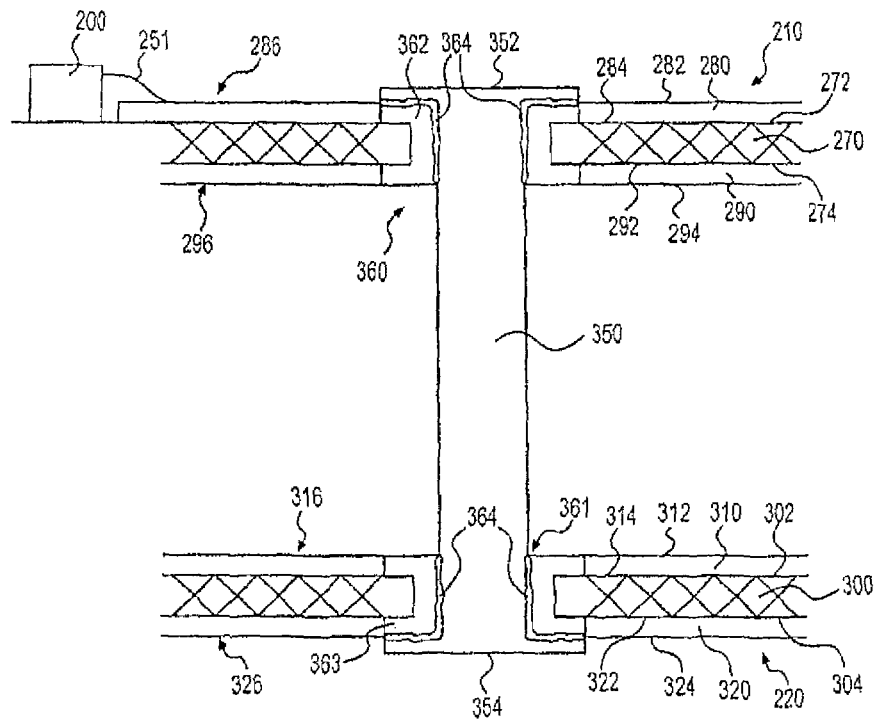
FIG. 12 illustrates in frontal view an exemplary embodiment of portions of an apparatus, constructed according to principles of the invention.

FIG. 12 illustrates in frontal view an exemplary embodiment of portions of an apparatus, constructed according to principles of the invention. As illustrated in FIG. 12, the first PCB 210 may include a first core 270 interposed between a first metal layer 280 and a second metal layer 290. In this illustrated implementation, a first metal layer second surface 284 may be generally biased against a first core first surface 272, and a second metal layer first surface 292 may be generally biased against the first core second surface 274 to form the first PCB 210. As would be understood by those of ordinary skill in the art upon review of this disclosure, various adhesives and other materials may be interposed between the first metal layer second surface 284 and the first core first surface 272, and/or between the first core second surface 274 and the second metal layer first surface 292. In other implementations, as would be recognized by those of ordinary skill in the art upon review of this disclosure, the first PCB 210 could include multiple cores with interposed metal layers. Moreover, in alternate implementations, the metal layer of the embodiments herein might be equivalently implemented by any suitable conducting material, perhaps including a non-metallic material that is suitable to be successfully adapted for applying to the first core first surface 272.

First traces 286 configured from the first metal layer 280 may be disposed upon the first core first surface 272 such that portions of the first core first surface 272 and portions of the first metal layer first surface 282 define the first PCB first surface 212 as illustrated in FIG. 11A. In various implementations, the first metal layer first surface 282 may be covered by a masking material so that the masking material and/or the first core first surface 272 define the first PCB first surface 212. The first metal layer first surface 282 may, in various implementations, be plated, coated, or otherwise treated, for example, to prevent oxidation. The LEDs 250, in this implementation, may be disposed about the first PCB first surface 212 to be in electrical communication with the first traces 286.

Similarly, in this exemplary implementation, second traces 296 configured from the second metal layer 290 may be disposed upon the first core second surface 274 such that portions of the first core second surface 274 and portions of the second metal layer second surface 294 may define the first PCB second surface 214. In various implementations, the second metal layer second surface 294 may be covered by a masking material so that the masking material and/or the first core second surface 274 define the first PCB second surface 214. The second traces 296 disposed upon the first core second surface, in this implementation, mirror the first traces 286 disposed upon the first core first surface 272, and the first traces 286 and the second traces 296 may be in electrical communication.

As illustrated in FIG. 12, the second PCB 220 may include a second core 300 interposed between a third metal layer 310 and a fourth metal layer 320. In this illustrated example, a third metal layer second surface 314 may be generally biased against the second core first surface 302, and a fourth metal layer first surface 322 may be generally biased against the second core second surface 304 to form the second PCB 220. As would be understood by those of ordinary skill in the art upon review of this disclosure, various adhesives and other materials may be interposed between the third metal layer second surface 314 and the second core first surface 302, and/or between the second core second surface 304 and the fourth metal layer first surface 322. In other implementations, as would be recognized by those of ordinary skill in the art upon review of this disclosure, the second PCB 220 could include multiple cores with interposed metal layers.

One or more third traces 316 configured from the third metal layer 310 may be disposed upon the second core first surface 302 such that portions of the second core first surface 302 and portions of the third metal layer first surface 312 define the second PCB first surface 222 in the illustrated exemplary implementation. In various implementations, the third metal layer first surface 312 may be covered by a masking material so that the masking material and/or the second core first surface 302 define the second PCB first surface 222.

Fourth traces 326 configured from the fourth metal layer 320 may be disposed upon the second core second surface 304 such that portions of the second core second surface 304 and portions of the fourth metal layer second surface 324 may define the second PCB second surface 224. In various implementations, the fourth metal layer second surface 324 may be covered by a masking material so that the masking material and/or the second core second surface 304 may define the second PCB second surface 224. One or more of the fourth traces 326 disposed upon the second core second surface 304, in this implementation, may be in electrical communication with one or more of the third traces 316 disposed upon the second core first surface 302.

The first core 270 and the second core 300 may comprise an electrically insulating material that may also be thermally insulating. Accordingly, the pins 30 may provide a path for efficient heat conduction through the first core 270 and/or through the second core 300.

In the illustrated exemplary implementation, a first power connector 342 and a second power connector 344 are received into the second PCB 220 and extend forth from the second PCB 220 to communicate electric power from a source to the second PCB 220. The second PCB 220 may include a driver circuit 395 configured to receive electric power from the source and to provide regulated electric power to the one or more LEDs 250 secured to the first PCB 210. The driver circuit 395 may include one or more electronics packages 346, which may be disposed about the second PCB first surface 222 and/or the second PCB second surface 224, as illustrated in FIG. 11C.

In the implementations, the first ends 32 of the pins 30 may be received in the first PCB 210 and the second ends 34 of the pins 30 may be received in the second PCB 220 to secure the first PCB 210 to the second PCB 220 at the interval 230, as illustrated. Also as illustrated, the first ends 32 of the pins 30 may be disposed generally about the first PCB first surface 212 and the second ends 34 of the pins 30 may be disposed about the second PCB second surface 224.

The pins 30 may form an array 260 in the interval 230 between the first PCB second surface 214 and the second PCB first surface 222, and the pins 30 may be set apart such that air flow 397 may pass around and through the array 260 to disperse heat from the array 260. As illustrated in FIG. 11B, the surfaces 35 of adjacent pins 30 may define gap 397, where the gap 397 may be sufficient for air to flow through to disperse heat from the pins 30 by convection.

At least a portion of the pins 30 generally proximate the first ends 32 may be in thermal communication with the LEDs 250 in order to conduct a portion of the heat generated by the LEDs 250 from the first PCB first surface 212 through the first core 270 to the first PCB second surface 214 for dispersal, at least in part, from the array 260. The second ends 34 of the pins 30 may, in some implementations, be in thermal communication with one or more electronics packages 346 secured to the second PCB second surface 224 to conduct at least a portion of the heat generated by the electronics packages 346 from the second PCB second surface 224 to the second PCB first surface 222 for dispersal from the array 260. In various implementations, one or more pins 30 may be in thermal communication with one or more electronics packages 346 disposed about the first PCB second surface 214 and/or disposed about the second PCB first surface 222 to communicate at least a portion of the heat from the one or more electronics packages 346 to the array 260 for dispersal.

As illustrated, a pin 350 may engage a third trace 316 and/or a fourth trace 326 on the second PCB 220 and may engage a first trace 286 and/or a second trace 296 on the first PCB 210 such that the first PCB 210 and the second PCB 220 may be in electrical communication. Accordingly, the driver circuit 395 configured on the second PCB 220 may communicate regulated power, for example, to drive the one or more LEDs 250 attached to the first PCB 210 through third trace 316 and/or fourth trace 326, through the pin 350 to the first trace 286 and/or second trace 296, and, thence, to one or more LEDs 250.

For example, a first via 360 is defined by a first conductive layer 362 and extends from the first PCB first side 212 to the first PCB second side 214, as illustrated in FIG. 12. The first conductive layer 362 may be composed of a metal such as copper or other electrically conductive material and is configured to place the second trace 296 in electrical communication, as illustrated. The first trace 286 and the second trace 296 are in electrical communication with LED 250 through the LED connector 251 secured to the first trace 286, as illustrated.

Portions of the pin 350 generally proximate the first pin end 352 are received in the first via 360 and secured by solder 364 in this implementation. Portions of the pin 350 generally proximate the first pin end 352 may be "star shaped" or otherwise configured in various ways as would be recognized by those of ordinary skill in the art upon review of this disclosure to take up solder. The first trace 286 and the second trace 296 may electrically communicate through the pin 350, in this implementation, as well as through the first conductive layer 362, and the first trace 286 and the second trace 296 may electrically communicate with the driver circuit 395 on the second PCB 220 through the pin 350.

As illustrated in FIG. 12, a second via 361 is defined by a second conductive layer 363 and extends from the second PCB first side 222 to the second PCB second side 224. The second conductive layer 363 may be composed of a metal such as copper or other electrically conductive material, and is configured to place the third trace 316 and the fourth trace 326 in electrical communication, as illustrated. Portions of the pin 350 generally proximate the second pin end 354 are received in the second via 361 and secured by solder 364 in this implementation. The driver circuit 395 may be in electrical communication with the third trace 316 and/or the fourth trace 326 and, as a consequence, with the LED 250 on the first PCB 210 through the pin 350.

Figure 14:
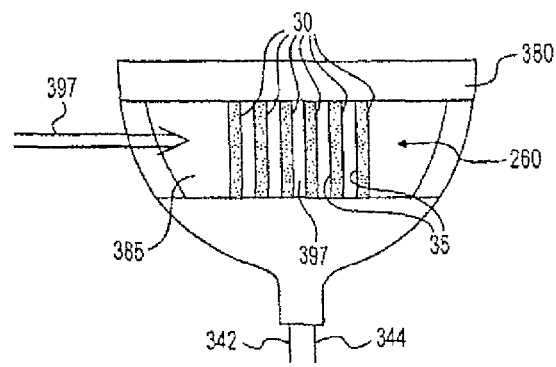
FIG. 14 illustrates in perspective view an exemplary embodiment of an apparatus, configured according to the principles of the invention.

As illustrated in FIGS. 11B and 14, an assembly 370 may include the first PCB 210 with one or more LEDs 250 disposed about the first PCB first surface 212, the second PCB 220 with the second PCB 220 configured to include the driver circuit 395, and with the first PCB 210 securably held at the interval 230 from the second PCB 220 by a plurality of pins 30 that form array 260. The assembly 370 may be positioned in a housing 380. The housing 380, in this exemplary implementation, may be configured to receive the assembly 370 and to maintain orientation of the LEDs 250 in order to direct light emitted from the LEDs 250. The housing 380 may define one or more apertures 385, and air flow 397 may pass through the one or more apertures 385, as indicated, either by free convection or by forced convection to disperse heat from the array 260. Heat may be dispersed from the array 260 by radiation through the one or more apertures 385.

Figure 13A:
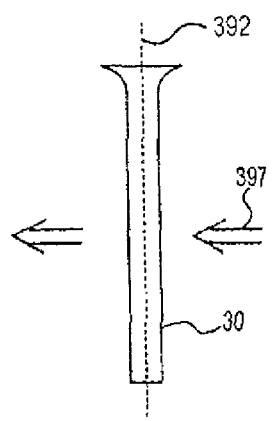
FIG. 13A illustrates in perspective view an exemplary embodiment of a pin, configured according to principles of the invention.
Figure 13B:
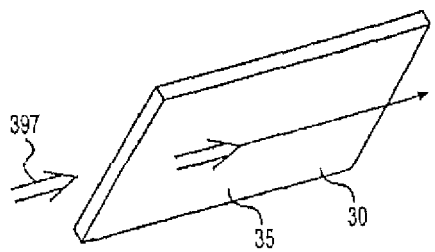
FIG. 13B illustrates in perspective view another exemplary embodiment of a pin, configured according to principles of the invention.

The one or more apertures 385 may be disposed circumferentially about the housing 380 such that the air flow 397 may pass through the one or more apertures 385 and through the array 260 generally normal to an axis 392 of the pins 30, as illustrated in FIG. 14. In implementations wherein the pins 30 may be substantially symmetrical about the axis 392, as illustrated in FIG. 13A for example, the pins 30 may be oriented such that the axis 392 may be more or less perpendicular to the air flow 397, and the air flow 397 may be at any circumferential orientation with respect to the axis 392. In other implementations, the pins 30 may have, for example, a generally rectangular configuration, perhaps with increased surface area, and may be oriented such that the air flow 397 may pass generally parallel to the rectangular surface 35, as illustrated in FIG. 13B.

In operation, the one or more LEDs 250 attached to the first PCB first surface 212 may generate heat. Pins 30 may thermally communicate with the one or more LEDs 250 to conduct heat from the one or more LEDs through the first PCB 210 from the first PCB first surface 212 to the first PCB second surface 214 and to disperse the heat from the array 260 in the interval 230 between the first PCB second surface 214 and the second PCB first surface 222. In some implementations, air flow 397 may be provided by forced convection to disperse the heat from the array 260, at least in part. In other implementations, air flow 397 by free convection may be provided to disperse the heat from the array 260, at least in part. In various implementations, one or more pins 30 may be in thermal communication with one or more electronics packages 346 secured to the first PCB first surface 212, the first PCB second surface 214, the second PCB first surface 222, and/or the second PCB second surface 224 to dissipate heat from the one or more electronics packages 346 from the array 260 in the interval 230. In various implementations, the driver circuit 395 may be configured onto the second PCB 220 and may electrically communicate with one or more LEDs 250 on the first PCB, at least in part, by one or more pins 350.

Methods, in various aspects, may include generating heat proximate the first surface 12 of the PCB 10 by an electronics package 20 and may include conducting the heat from the first surface 12 to the second surface 14, at least in part, using a plurality of pins 30. The methods may include dispersing heat from any array 120 defined by a plurality of extensions 36.

The methods may include securing the backplane 60, at least in part, by a plurality of pins 30.

In the apparatus described above, the one or more electronics packages may include one or more lighting devices, computing devices, memory storage devices, communication devices, and/or the like. For example, the lighting devices may be LEDs and any associated electronics. Further, with respect to the aspects described above, the assembly 370 may include a light, a computer, a storage device, a telecommunications device or the like, or any combination thereof.

Figure 15:
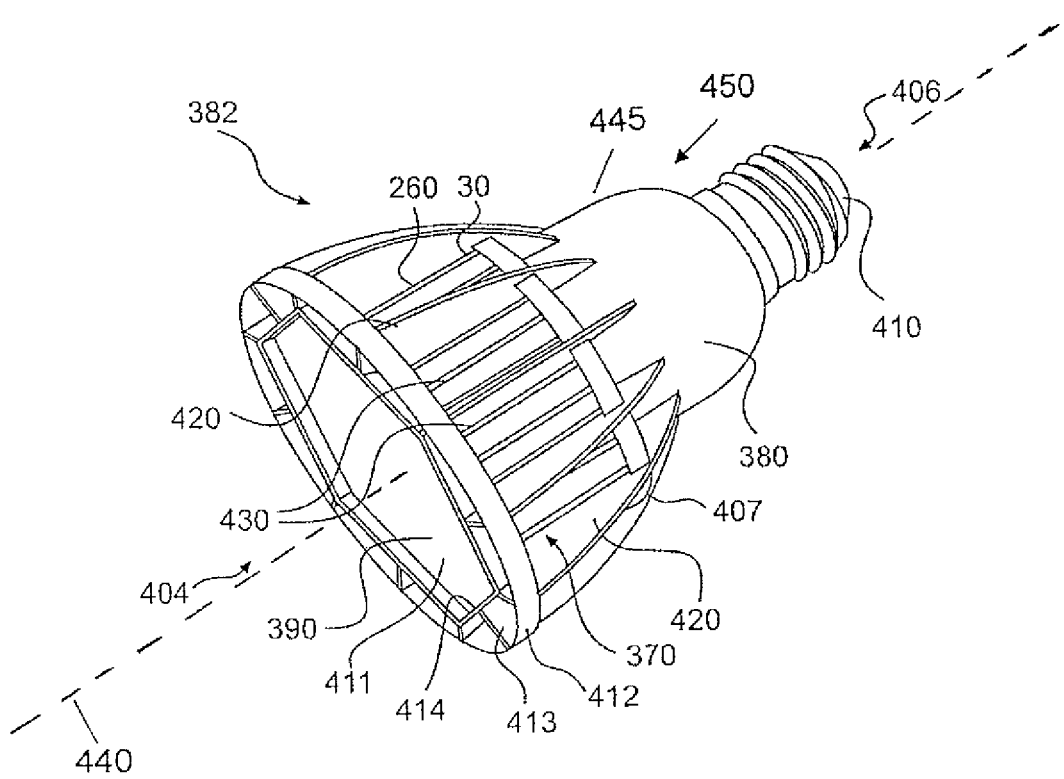
FIG. 15 illustrates in perspective view an exemplary embodiment of a light assembly, configured according to principles of the invention.

FIG. 15 illustrates in perspective view an exemplary embodiment of a light assembly, configured according to principles of the invention. In particular, FIG. 15 shows a light assembly 382 that includes housing 380 having a housing first end and a housing second end and arranged around a central axis 440, substantially internal electrical components such as assembly 370, and an illumination end 390. In different applications, the light assembly 382 may include, but not limited to, any embodiment of FIGS. 1-14 herein. The light assembly 382 may be configured to receive an electrical component assembly (e.g., assembly 370) generally within and/or substantially enveloped by the housing 380. However, certain portions of the electrical component assembly may be external to the housing, such as portions of power connectors 342, 344 (shown in FIG. 14), for example.

The housing 380 may orient an electrical connector for receiving external power, such as configured to include a standard screw type electrical connection 410, similar to incandescent type bulbs. Other types of connections for other light arrangements are contemplated.

The housing 380 may also include a slotted, or fin 420 type construction (such as, e.g., to create the one or more apertures 385 shown in FIG. 14) that allows air flow, generally to a volume of space generally within the housing 380, and in particular, to and past the pins 30, which may be arranged to form an array 260, for venting generated heat out of the housing 380. The housing 380 may be formed of any material including synthetic materials such as plastic. The housing 380 may be configured to include a plurality of openings 430 (or vents) about the circumference of the housing 380.

The plurality of openings 430 may be defined by a plurality of fins 420. The fins 420 may have a first fin end and a second fin end and may be configured to provide structural integrity to the housing by connecting a first portion of the light assembly proximate the illumination end 390 to a second portion proximate the electrical connection 410. Each of the fins 420 may have a curvature extending from each fin second end such that the plurality of fins 420 converge towards the central axis 440 proximate each fin first end. The fin first end may be proximate or merge with a common portion 445 of the housing. The plurality of fins 420 may be configured to form a plurality of vents therebetween. The plurality of fins 420 may be shaped in a curved fashion from the first portion towards the second portion. The curvature of the plurality of fins 420 may extend from proximate the illumination end 390, i.e., housing first end, for a length approximately half the total length (a length measured from the housing first end 404 to the housing second end 406) of the housing 380, and may merge and converge and at a common portion 445 of the housing 380. The plurality of fins may be arranged around the central axis 440.

In one aspect, the curvatures of the fins 420 may aid to impart an overall visual form of the light assembly 382 that generally resembles or mimics a shape related to common flood or spot lights, for example. The overall shape of the housing may mimic or resemble a PAR 30 or a PAR 38 light. The housing 380 may have a circumference larger at a housing first end 404 greater than a housing second end 406. A circumference of the housing at approximately the mid-point 407 of the length of the housing may be less than that circumference at the first end 404, but greater than the circumference proximate the housing second end 406. The housing first end 404 may be proximate the illumination end 390. The housing first end 404 may be configured to include a ring portion 412 in housing 380 such that a spacing 413 may be formed between the ring portion 412 and an illumination portion 411 of the illumination end 390 by the plurality of fins 420. The circumference of the ring portion 412 may be more than twice the circumference of the housing 380 proximate the second end 406.

The illumination portion 411 may be mated with an inner housing portion 414 that may be formed in a polygonal shape, but any suitable shape may be employed that substantially matches with the shape of the illumination portion 411. The circumference of illumination portion 411 may substantially match or align in close proximity with the circumference of the inner housing portion 411.

In some embodiments, a circumference at one end of the housing 380, such as end proximate the first PCB 210 (FIG. 11B) or proximate the housing first end 404, may be configured to be in contact with a circumference of one of the PCBs (e.g., PCB 210) of assembly 370 (FIG. 11B). For example, a circumferential edge of PCB 210 may mate, or align in close proximity, with an internal circumference at an end of the housing 380. An endpiece 450 proximate the housing second end 406 may and arranged proximate to an end of each fin. The endpiece 450 may have a continuous circumference about the central axis 440. An electrical connector 410 may be arranged proximate the endpiece 450 and along the central axis 440. A space may be provided arranged along the central axis 440 proximate the housing second end 406 and further configured with the plurality of fins and the plurality of vents arranged therearound. The space configured, at least in part, to accept or house a light assembly.

In some applications, the light assembly 382 may be covered by a separate face-plate cover (not shown) on the illumination end 390 to assist in repulsing environmental elements and/or aid in focusing emitted light. Although, the lights of the invention are well-suited as light sources for homes and businesses (i.e., for producing visible white light), such as shown in FIG. 15, the embodiments of the invention may be also well-suited as light sources for computer monitors, TVs, video displays, projectors, and the like.

In accordance with various embodiments of the invention, the methods described herein are intended for operation with dedicated hardware implementations including, but not limited to, semiconductors, application specific integrated circuits, programmable logic arrays, and other hardware devices constructed to implement the methods and modules described herein.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed:

1. A method for configuring a light assembly, the method comprising:

arranging a housing comprising a housing first end and a housing second end arranged along a central axis;

arranging on the housing a plurality of fins each having a fin first end and a fin second end, the plurality of fins forming a plurality of spaces therebetween, each the plurality of fins has a curvature extending from the fin second end such that the plurality of fins converge towards the central axis proximate each fin first end, a width of each formed space being greater then a width of each fin forming a respective space;

arranging an endpiece proximate the housing first end proximate to the fin first end of each of the plurality of fins, the endpiece having a circular portion comprising a continuous circumference about the central axis;

arranging an electrical connector proximate to the endpiece and arranged along the central axis;

arranging a space along the central axis proximate the housing second end and further configured with the plurality of fins arranged therearound, the space configured to, at least in part, house a light assembly; and arranging openings between the fins to allow air flow.

2. The method of claim 1, wherein the plurality of fins are configured to form a parabolic shape, at least in part.

3. The method of claim 1, wherein the fins are arranged proximate an electronic heat generating source within the space.

4. The method of claim 1, wherein the plurality of fins converge and merge with a common portion of the housing about midway along an overall length of the housing.

5. The method of claim 1, wherein the housing forms a shape similar to at least one of a PAR 30 or a PAR 38 light.

6. The method of claim 1, wherein the light assembly is configured to emit light out of the housing second end.

7. The method of claim 1, wherein the light assembly includes one or more light emitting diodes (LED).

8. The method of claim 1, wherein at least a portion of the housing is formed of a synthetic material.

9. The method of claim 1, wherein at least a portion of the plurality of fins is formed of a synthetic material.

10. The method of claim 1, wherein each fin has an outer edge and further comprising a ring configured around the outer edge proximate each fin second end forming an outermost circumference of the housing and the ring having the largest circumference of the housing.

11. A method for configuring a light assembly, the method comprising:

arranging a housing comprising a housing first end and a housing second end arranged along a central axis;

arranging on the housing a plurality of fins each having a fin first end and a fin second end, the plurality of fins forming a plurality of spaces therebetween, each the plurality of fins has a curvature extending from the fin second end such that the plurality of fins converge towards the central axis proximate each fin first end, a width of each formed space being greater then a width of each fin forming a respective space;

arranging an endpiece proximate the housing first end proximate to the fin first end of each of the plurality of fins;

arranging an electrical connector proximate to the endpiece and arranged along the central axis;

arranging a space along the central axis proximate the housing second end and further configured with the plurality of fins arranged therearound, the space configured to house a light assembly; and arranging openings between the fins to allow air flow.

12. The method of claim 11, wherein the plurality of fins are configured to form a parabolic shape, at least in part.

13. The method of claim 11, wherein the fins are arranged proximate an electronic heat generating source within the space.

14. The method of claim 11, wherein the plurality of fins converge and merge with a common portion of the housing about midway along an overall length of the housing.

15. The method of claim 11, wherein the housing forms a shape similar to at least one of a PAR 30 or a PAR 38 light.

16. The method of claim 11, wherein the light assembly is configured to emit light out of the housing second end.

17. The method of claim 11, wherein the light assembly includes one or more light emitting diodes (LED).

18. The method of claim 11, wherein at least a portion of the housing is formed of a synthetic material.

19. The method of claim 11, wherein at least a portion of the plurality of fins is formed of a synthetic material.

20. The method of claim 11, further comprising a ring portion proximate the housing second end, the ring portion having a continuous circumference about the central axis and the ring portion being attached to the plurality of fins at the fin second end to space the plurality of fins.

21. The method of claim 11, wherein each fin has an outer surface and further comprising a ring configured around the outer surface proximate each fin second end and forming an outermost circumference of the housing and the ring having the largest circumference of the housing.

* * * * *